(12) United States Patent
Sim et al.

(10) Patent No.: US 10,608,057 B2
(45) Date of Patent: Mar. 31, 2020

(54) DISPLAY DEVICE INCLUDING TOUCH ELECTRODE

(71) Applicant: LG Display Co., Ltd., Seoul (KR)

(72) Inventors: JaeHo Sim, Daegu (KR); SangWoo Seo, Daegu (KR)

(73) Assignee: LG Display Co., Ltd., Seoul (KR)

( * ) Notice: Subject to any disclaimer, the term of this patent is extended or adjusted under 35 U.S.C. 154(b) by 117 days.

(21) Appl. No.: 15/715,124

(22) Filed: Sep. 25, 2017

(65) Prior Publication Data

US 2018/0145114 A1 May 24, 2018

(30) Foreign Application Priority Data

Nov. 21, 2016 (KR) .................... 10-2016-0155246

(51) Int. Cl.
*H01L 27/32* (2006.01)
*G06F 3/041* (2006.01)
*G06F 3/044* (2006.01)

(52) U.S. Cl.
CPC ............ *H01L 27/323* (2013.01); *G06F 3/044* (2013.01); *G06F 3/0412* (2013.01); *G06F 3/0416* (2013.01); *G06F 3/0418* (2013.01); *H01L 27/3272* (2013.01); *H01L 27/3276* (2013.01); *G06F 2203/04107* (2013.01)

(58) Field of Classification Search
None
See application file for complete search history.

(56) References Cited

U.S. PATENT DOCUMENTS

2013/0285971 A1* 10/2013 Elias .................. G06F 3/044
345/174

\* cited by examiner

*Primary Examiner* — Brian M Butcher
(74) *Attorney, Agent, or Firm* — Fenwick & West LLP

(57) ABSTRACT

A display device comprises a plurality of touch electrodes, a link portion including first wiring configured to transmit an AC signal and a touch electrode line configured to transmit a touch drive signal to a corresponding one of the touch electrodes, the first wiring disposed in a first layer and the touch electrode line disposed in a second layer different from the first layer; and a shield layer disposed between the first layer and the second layer where the first wiring overlap the touch electrode line. A constant voltage is applied to the shield layer.

20 Claims, 8 Drawing Sheets

DISPLAY DEVICE INCLUDING TOUCH ELECTRODE

CROSS REFERENCE TO RELATED APPLICATION

This application claims priority from Korean Patent Application No. 10-2016-0155246, filed on Nov. 21, 2016, which is hereby incorporated by reference for all purposes as if fully set forth herein.

BACKGROUND OF THE INVENTION

1. Field of the Invention

Various embodiments disclosed herein relate to an organic light emitting display device including a touch electrode.

2. Description of the Prior Art

An organic light emitting display device is a display device that displays an image by employing an organic light emitting diode. An organic light emitting diode is a self-luminous element that emits light by itself, and has advantages of a high response speed, a high luminous efficiency, a high luminance, and a wide viewing angle.

An organic light emitting display device is operated by receiving a user's command through various input devices, such as a keyboard and a mouse. An input device, which allows a user's command to be intuitively and conveniently input by touching the screen of the display device, is being developed. For this purpose, a touch panel is disposed on a screen of a display device, and a user can input a command of the user by touching while viewing the screen of the display device. However, when a touch panel is placed on the organic light emitting display device, the display device is thick and heavy due to the touch panel, and a problem may occur in terms of visibility due to the deterioration of luminance. In addition, in recent years, efforts are being made to implement thinner and lighter display devices due to the distribution of mobile devices and the aesthetics thereof.

In order to implement an organic light emitting display device to be thin, a method of mounting a touch electrode on the display device has been considered. The touch electrode senses a touch using a capacitance, which is proportional to the area of the touch electrode and inversely proportional to the distance. When the touch electrode is mounted on the display device, the distance between the touch electrode and a wiring within the display device is shortened, and the touch may not be accurately detected due to parasitic capacitance between the touch electrode and the wirings.

SUMMARY

Embodiments disclosed herein a display device which can be implemented to be thin.

Embodiments disclosed herein provide a display device in which a touch can be correctly sensed.

In one aspect, embodiments disclosed herein provide a display device that includes: a display unit formed on a substrate and including a plurality of pixels; a plurality of touch electrodes disposed on the display unit and configured to sense a touch point; a link portion formed on the substrate adjacent to the display unit, and the link portion including a plurality of wirings configured to transmit an AC voltage and a constant voltage to the display unit; a touch electrode line connected to at least a corresponding one of the plurality of touch electrodes to transmit a touch drive signal; and a shield layer disposed between the touch electrode line and one or more wirings of the link portion, the constant voltage being applied to the shield layer.

In another aspect, embodiments disclosed herein provide a display device that includes: a substrate including a display unit on which a plurality of pixels are disposed in a region where gate lines and data lines intersect each other, and a link portion, the link portion including a plurality of wirings configured to transmit an AC voltage and a constant voltage to the display unit; a plurality of touch electrodes disposed on the display unit and configured to sense a touch point on the display unit; a driver IC disposed on a side of the substrate, and configured to apply the AC voltage and the constant voltage to the wirings of the link portion and to transmit/receive a signal from the plurality of touch electrodes through a touch electrode line; and a shield layer disposed between the touch electrode line and one or more of the wirings of the link portion, the constant voltage being applied to the shield layer.

In still another aspect, a display device comprises a plurality of touch electrodes; a link portion including first wiring configured to transmit an AC signal and a touch electrode line configured to transmit a touch drive signal to a corresponding one of the touch electrodes, the first wiring disposed in a first layer and the touch electrode line disposed in a second layer different from the first layer; and a shield layer disposed between the first layer and the second layer where the first wiring overlap the touch electrode line.

The shield layer may be a conductive layer. In some embodiments, a constant voltage may be applied to the shield layer.

In some embodiments, the display device further comprises gate lines and data lines and a plurality of pixels at intersections of the gate lines and the data lines, and wherein the first wiring transmits the AC signal to at least one of the gate lines and the data lines. In some embodiments, the touch drive signal is an AC signal. In some embodiments, the link portion may further include a second wiring configured to transmit the constant voltage to the shield layer.

In some embodiments, the first wiring is formed in a same layer as a gate electrode of a thin film transistor of the display device. In some embodiments, the shield layer is formed in a same layer as a source electrode and a drain electrode of a thin film transistor of the display device.

According to the embodiments disclosed herein, it is possible to implement the thickness of an organic light emitting display device to be thin. According to the embodiments disclosed herein, it is possible to reduce the magnitude of the parasitic capacitance generated between the touch electrode and the wirings within the display device. As a result it is possible to correctly sense a touch through a touch electrode provided in an organic light emitting display device.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE EXEMPLARY EMBODIMENTS

Figure 1A:
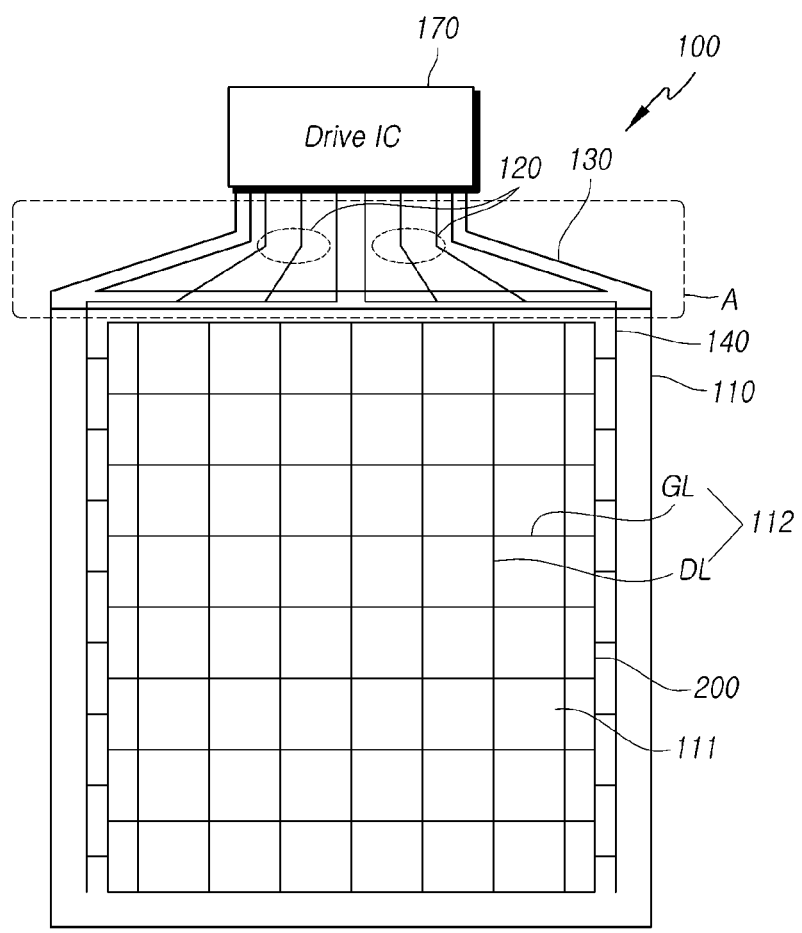
FIG. 1A is a plan view illustrating an embodiment of an organic light emitting display device according to the present invention.

Hereinafter, some embodiments of the present invention will be described in detail with reference to the accompanying illustrative drawings. In designating elements of the drawings by reference numerals, the same elements will be designated by the same reference numerals although they are shown in different drawings. Further, in the following description of the present invention, a detailed description of known functions and configurations incorporated herein will be omitted when it may make the subject matter of the present invention rather unclear.

In addition, terms, such as first, second, A, B, (a), (b) or the like may be used herein when describing components of the present invention. Each of these terminologies is not used to define an essence, order or sequence of a corresponding component but used merely to distinguish the corresponding component from other component(s). In the case that it is described that a certain structural element "is connected to", "is coupled to", or "is in contact with" another structural element, it should be interpreted that another structural element may "be connected to", "be coupled to", or "be in contact with" the structural elements as well as that the certain structural element is directly connected to or is in direct contact with another structural element.

Figure 1B:
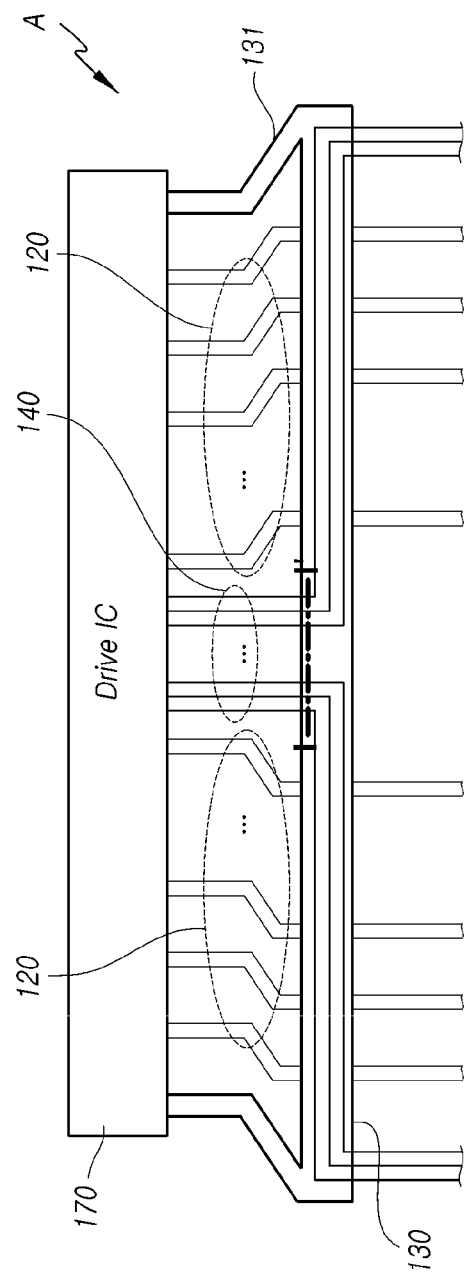
FIG. 1B is an enlarged plan view of a link portion illustrated in FIG. 1A.

FIG. 1A is a plan view illustrating an embodiment of an organic light emitting display device according to the present invention, and FIG. 1B is an enlarged plan view of a link portion illustrated in FIG. 1A. In addition, FIG. 1C is a cross-sectional view taken along line I-I' in FIG. 1B.

Figure 1C:
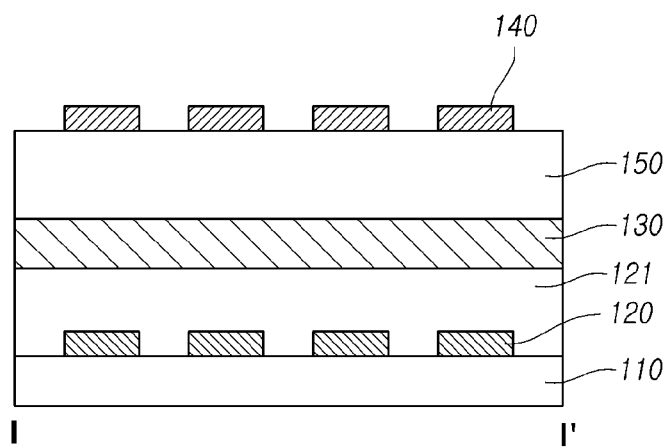
FIG. 1C is a cross-sectional view taken along line I-I" in FIG. 1B.

Referring to FIGS. 1A to 1C, an organic light emitting display device 100 may include: a display unit 111 including a plurality of pixels (not illustrated); a plurality of touch electrodes 200 disposed on the display unit 111 and configured to sense a touch point; a link portion A disposed on one side of the display unit 111 and configured to transmit each of an AC voltage and a constant voltage; a touch electrode line 140 connected to a plurality of touch electrodes 200 to transmit a touch signal; and a shielding layer 130 disposed between the touch electrode line 140 and the link portion A at a position where the touch electrode line 140 and the linking portion A overlap each other, the constant voltage being applied to the shield layer 130. The shielding layer 130 may be formed of electrically conductive material.

The display unit 111 may be formed on a substrate 110. In addition, the link portion A may be formed on the substrate 110. The region where the display unit 111 is formed on the substrate 110 may be referred to as an active region, and the region where the link portion A is formed may be referred to as an inactive region. However, the present invention is not limited thereto. The display unit 111 may include a plurality of pixels, and may be connected to wirings 112 configured to apply signals to the pixels. Each of the wirings 112 may include a gate line GL, a data line DL, and a power supply line (not shown herein). However, the present invention is not limited thereto.

The link portion A may be disposed on one side of the substrate and may be connected to the display unit 111. The link portion A may include first wirings 120 configured to transmit the AC voltage to the display unit 111 and second wirings 131 configured to transmit the constant voltage. The AC voltage may mean a voltage that is instantaneously changed, and the constant voltage may mean a voltage that is not instantaneously changed. Here, the first wirings 120 and the second wirings 131 may be connected to the wirings that apply signals to the pixels within the display unit 111. The first wirings 120 may be formed with a gate metal within the display unit 111, and the second wirings 131 may be wired with a source drain metal.

The AC voltage transmitted through the first wirings 120 may be a driving signal for driving the display unit 111. The driving signal for driving the display unit 111 may be a gate signal or a data signal. However, the present invention is not limited thereto. The constant voltage transmitted to the display unit 111 and applied to the pixels through the second wiring 131 may be a high potential voltage or a low potential voltage. However, the present invention is not limited thereto. In addition, the first wirings 120 and the second wirings 131 may be formed in various patterns to correspond to the distances connected to the wirings of the display unit 111.

On the display unit 111, the touch electrodes 200 may be formed to sense a touch. Here, the touch electrodes 200 are illustrated as a single film, but are not limited thereto. For a touch sensing method using the touch electrodes 200, some of the touch electrodes are connected to touch electrode lines that transmit a touch driving signal, and the remaining touch electrodes may be connected to touch electrode lines that output a touch sensing signal. In addition, a touch may be sensed through a mutual capacitance method for sensing a touch point on the display unit 111 by sensing a change in capacitance between a touch electrode, which receives a touch driving signal generated by a touch, and a touch electrode, which is connected to a touch sensing line, and a self-capacitance method for sensing a touch by the capacitance formed between a touch electrode and a finger or a touch pen. Here, the term "touch" does not only mean directly touching a point on the display unit 111, but includes hovering by a finger or a touch pen within a certain distance from a point without directly touching the point.

The touch electrodes 200 may receive the touch driving signal through the touch electrode lines 140. In addition, a touch sensing signal may be output through the touch electrode lines 140. In the case of the mutual capacitance type, the touch electrode lines that transmit the touch driving signal and the touch electrode lines that output the touch sensing signal may be different lines. In addition, in the case of the self-capacitance type, the touch electrode lines that transmit the touch driving signal and the touch electrode lines that output the touch sensing signal may be the same touch electrode lines.

The display unit 111 may be connected to a drive IC 170 so as to receive the AC voltage and the constant voltage. The drive IC 170 may transmit the AC voltage and the constant voltage to the display unit through the link portion A. The AC voltage output from the drive IC 170 may be a data signal or a gate signal. In addition, the constant voltage output from the drive IC 170 may be a high potential voltage or a low potential voltage. However, the present invention is not limited thereto. In addition, the drive IC 170 is illustrated as being directly connected to the link portion A, but is not limited thereto. The drive IC 170 may be connected to the link portion A on the substrate 110 through a Flexible Printed Circuit Board (FPCB). In addition, the drive IC 170 may be connected to the link portion A in the form of a Chip On Film (COF).

The drive IC 170 is connected to the link portion A, and may transmit a signal having an AC voltage and a constant voltage to the display unit 111. The AC voltage may be a gate signal or a data signal, and the constant voltage may be a high potential voltage or a low potential voltage. However, the present invention is not limited thereto.

Here, the link portion A is illustrated as including first wirings 120 that output an AC voltage, second wirings 131 that output a constant voltage, and touch electrode lines 140 connected to the touch electrodes 200, and as being connected to one drive IC 170. However, without being limited thereto, the drive IC 170 may include a first drive IC (not illustrated) that transmits a drive signal to the display unit 111 and a second drive IC (not illustrated) that transmits a touch drive signal (typically an AC voltage signal) to the touch electrodes 200. In addition, the first drive IC may be connected to the first wirings 120 and the second wirings 131, and the second drive IC may be connected to the touch electrode lines 140. Here, the second drive IC may be referred to as a touch drive IC.

In addition, referring to FIG. 1B, in the portion where the link portion A is formed, the first wirings 120 and the second wirings 131, which are connected to the drive IC 170, and the touch electrode lines 140 may overlap each other. Since the first wirings 120 transmit the AC signal, the touch electrode lines 140 are affected by the AC signal transmitted through the first wirings 120, thereby generating noise, and as a result, a touch point may not be correctly distinguished.

Accordingly, as illustrated in FIG. 1C, when a shielding layer 130 is disposed between the first wirings 120 and the touch electrodes 140 and constant power is applied to the shielding layer 130, the influence of the AC voltage flowing through the first wirings 120 due to the constant power on the touch electrode 140 is blocked, so that the generation of noise can be suppressed, and as a result, the touch point can be correctly discriminated.

As illustrated in FIG. 1A, by connecting the second wirings 131, which are connected to both ends of the display unit 111 to apply the constant voltage, to the second wirings 131, the constant voltage, which is transmitted through the wiring 131, can be transmitted to the shielding layer 130. The second wirings 131 and the shielding layer 130 may be formed on the same layer. The second wirings 131 and the shielding layer 130 may be formed by depositing and patterning the source drain metal of the display unit.

In addition, as illustrated in FIG. 1C, the first wirings 120 are patterned and formed on the substrate 110, and an insulating film 121 is deposited on the first wirings 120. In addition, the shielding layer 130 may be formed on the insulating film 121, and a sealing substrate 150 may be disposed on the shielding layer 130. The sealing substrate 150 may be mounted with an organic film and a thin film transistor disposed between the substrate 110 and the sealing substrate 150. Then, the touch electrodes 140 may be patterned and formed on the sealing substrate 150. The touch electrodes 140 may be formed on the sealing substrate 150 such that the touch electrodes 140 can be mounted on the display device. Further, the first wirings 120 may be formed by patterning a gate metal.

Figure 2A:
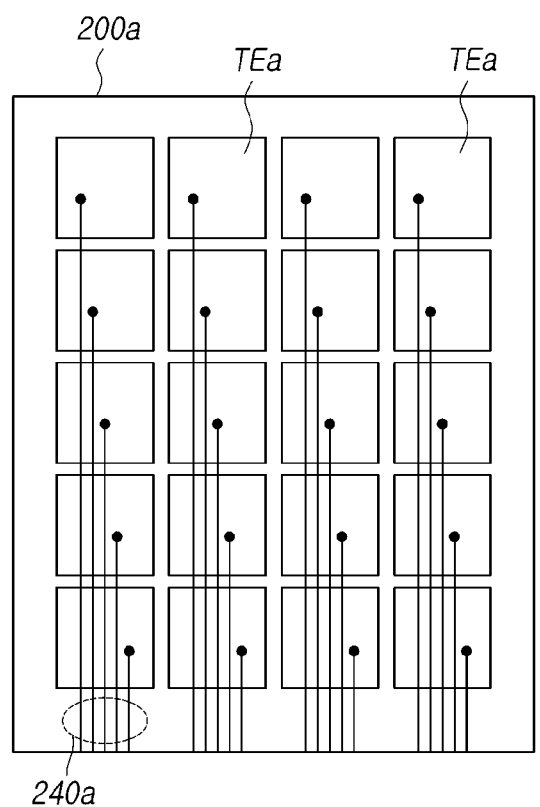
FIG. 2A is a plan view illustrating a first embodiment of a touch electrode illustrated in FIG. 1A.
Figure 2B:
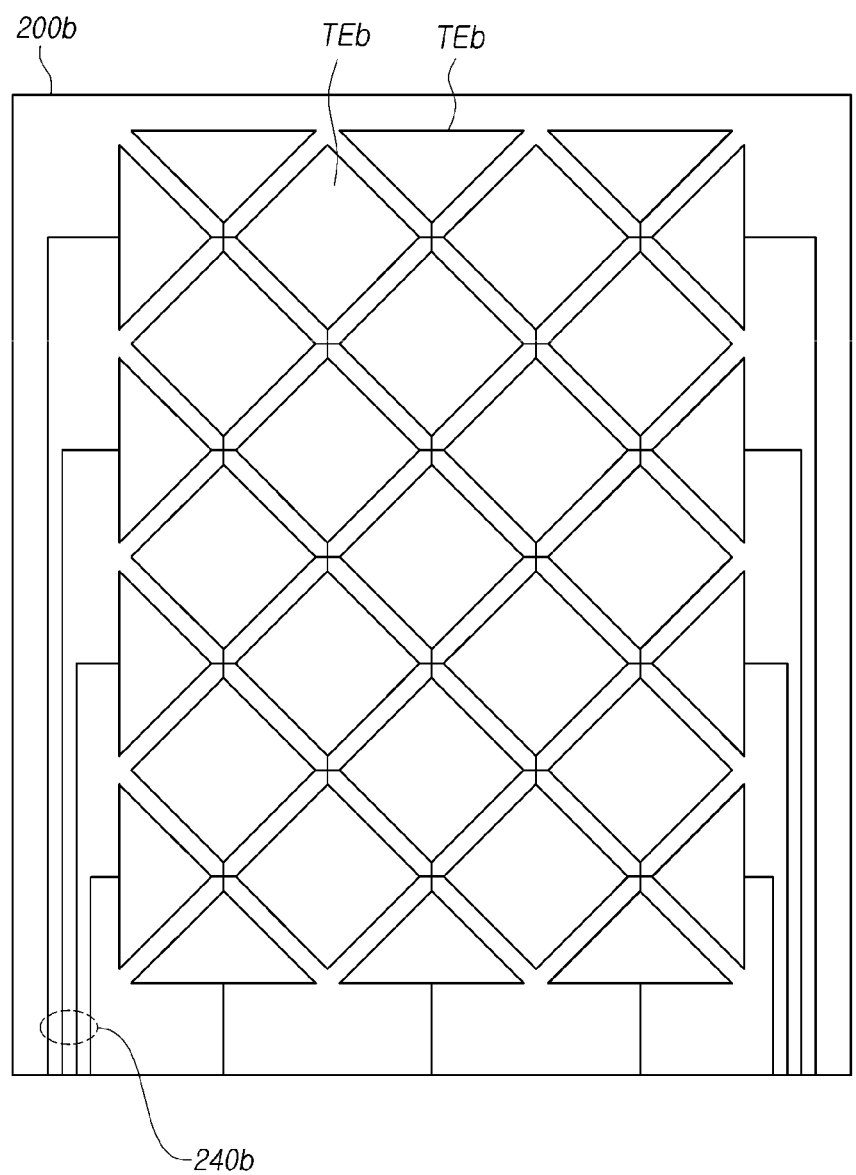
FIG. 2B is a plan view illustrating a second embodiment of the touch electrode illustrated in FIG. 1A.

FIG. 2A is a plan view illustrating a first embodiment of the touch electrodes illustrated in FIG. 1A, and FIG. 2B is a plan view illustrating a second embodiment of the touch electrodes illustrated in FIG. 1A.

Referring to FIG. 2A, touch electrodes TEa may be disposed on the display unit 111 of FIG. 1A, and one touch electrode line 240a may be connected to each touch electrode TEa. In addition, the touch electrode lines 240a may partially overlap at least one touch electrode TEa among the touch electrodes TEa. In addition, when a finger or a touch pen touches a point on the display unit in the state where the touch electrodes TEa are supplied with a touch driving signal through the touch electrode lines 240a, capacitance is generated between the touch electrode TEa and the finger or the touch pen, and a touch sensing signal sensing the generated capacitance may be output through the touch electrode lines 240a.

In addition, as illustrated in FIG. 2B, each of the touch electrodes TEb may have a diamond shape, and the touch electrodes may be connected in the horizontal direction, or in the vertical direction. In addition, each of the touch electrodes TEb disposed in an outer peripheral edge may have a triangular shape.

Among the touch electrodes TEb, the touch electrodes connected in the horizontal direction may be connected to touch drive lines among the touch electrode lines 240a so as to receive a touch driving signal, and the touch electrodes TEb connected in the vertical direction may be connected to the touch sensing lines among the touch electrode lines 240a so as to output a touch sensing signal.

In addition, when a point is touched with a finger or a touch pen, the capacitance between the touch electrodes TEb connected in the horizontal direction and the touch electrodes TEb connected in the vertical direction may be changed, and a touch sensing signal may be output to correspond to the change in the capacitance.

The touch electrodes TEa and TEb may be transparent electrodes. In addition, the touch electrodes TEa and TEb may be in the form of a mesh, and a plurality of openings may be formed in each of the touch electrodes TEa and TEb, so that light emitted from the display unit can permeate the touch electrodes.

Here, the number of touch electrodes TEa and TEb is not limited to that illustrated in the drawings, and the number of touch electrodes TEa and TEb, which are arranged on the display unit, is variable depending on the size of the display unit and the sizes of the touch electrodes TEa and TEb.

In addition, the touch electrode lines 240a and 240b, connected to the touch electrodes TEa and TEb, are supplied with or output a touch driving signal and a touch sensing signal. The touch electrodes TEa and TEb on the display unit 111 are not affected by the driving signal that drives the display unit 111, which is disposed below the touch electrodes TEa and TEb. The reason for this is that the upper side of the display unit 111 is covered with the cathode electrodes of organic light emitting diodes, and a constant low potential voltage is applied to the cathode electrodes. It is also possible to prevent the AC voltage, which flows in the gate line and/or the data line in the display unit, from affecting the touch electrode by the voltage of the cathode electrode.

Therefore, the touch electrodes TEa and TEb on the display unit 111 can suppress the generation of noise in the touch electrodes due to the gate signal and/or the data voltage applied to the gate lines and/or the data lines.

However, in the case of the link portion A other than the display unit 111, the AC voltage may affect the touch electrode lines because cathode electrodes are not disposed in the link portion A. However, as illustrated in FIGS. 1A to 1C, when the shielding layer 130 is formed in a region where the touch electrode lines 140 and the first wirings 120 of the link portions A overlap each other, the touch electrode lines 140 are not affected by the AC voltage flowing in the first wirings 120 in the link portion A, so that the occurrence of noise in the touch electrode lines 140 can be suppressed.

Figure 3:
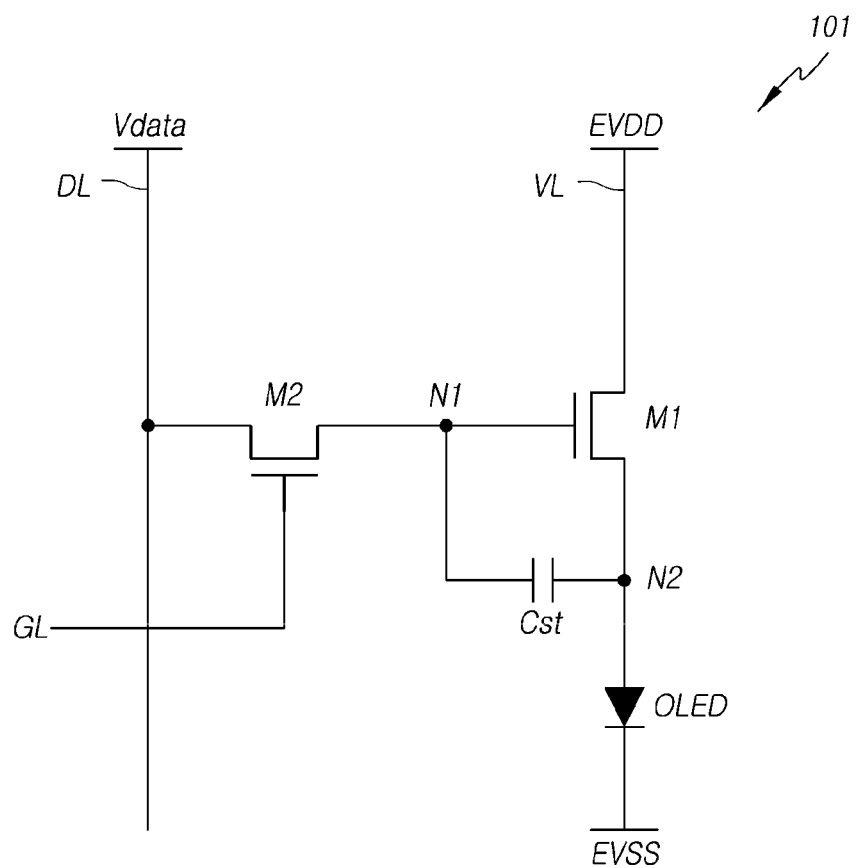
FIG. 3 is a circuit diagram illustrating an embodiment of a pixel employed in the organic light emitting display device illustrated in FIG. 1A.

FIG. 3 is a circuit diagram illustrating an embodiment of a pixel employed in the organic light emitting display device illustrated in FIG. 1A.

Referring to FIG. 3, a pixel 101 may include an Organic Light Emitting Diode (OLED), first and second transistors M1 and M2, and a capacitor Cst. Here, the first transistor M1 may be a driving transistor that drives the current flowing in the OLED, and the second transistor M2 may be a switching transistor that switches a data voltage.

The first electrode of the first transistor M1 may be connected to a high potential line VL, to which a high potential voltage EVDD is transmitted, the second electrode of the first transistor M1 may be connected to the anode of the OLED, and the gate electrode may be connected to a second node N2. The first transistor M1 may drive the current from the first electrode to the second electrode according to the voltage difference between the gate electrode and the second electrode.

The first electrode of the second transistor M2 may be connected to a data line DL, the second electrode may be connected to a first node N1, and the gate electrode may be connected to a gate line GL. The second transistor M2 may transmit a data voltage Vdata corresponding to a data signal, which is transmitted through a data line DL, to the first node N1 in response to a gate signal, which is transmitted through the gate line GL.

The capacitor Cst may be connected between the gate electrode and the second electrode of the first transistor so as to maintain a constant voltage between the gate electrode and the second electrode of the first transistor M1.

In the OLED, the anode electrode may be connected to the second electrode of the first transistor M1, and a low potential voltage EVSS may be applied to the cathode electrode. The OLED may emit light in response to a current that flows from the anode electrode to the cathode electrode.

The first electrode of each transistor may be a drain electrode, and the second electrode may be a source electrode. However, the present invention is not limited thereto. In addition, although each transistor is illustrated as being a PMOS transistor, the transistor may be an NMOS transistor without being limited thereto.

The pixel illustrated in FIG. 3 is represented as an example, and the pixel structure of the present invention is not limited thereto.

Figure 4:
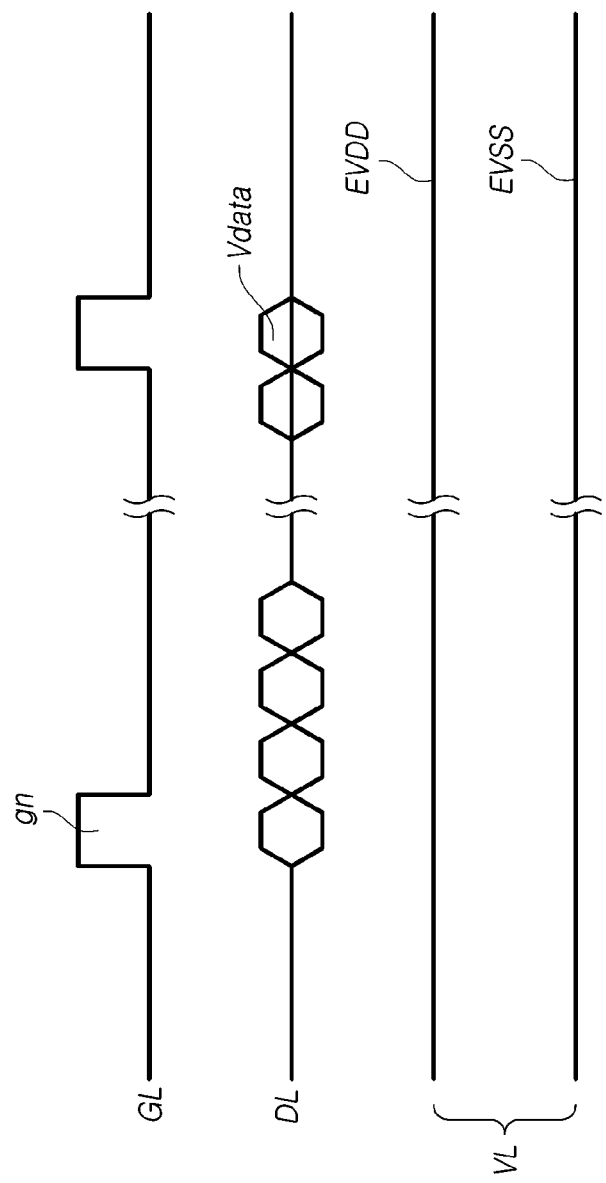
FIG. 4 is a timing chart illustrating an embodiment of an operation of a pixel illustrated in FIG. 3.

FIG. 4 is a timing chart illustrating an embodiment of an operation of the pixel illustrated in FIG. 3.

Referring to FIG. 4, a gate signal gn may be transmitted to the gate line GL at a predetermined interval. The predetermined interval may correspond to a time interval at which one vertical synchronous signal is input. However, the present invention is not limited thereto. A data voltage Vdata corresponding to a data signal is applied to the data line DL, and the data voltage Vdata may vary in magnitude depending on gradation. The data voltage Vdata may be maintained for the duration of one horizontal synchronization.

When the gate signal gn is transmitted to the gate line GL, the second transistor M2 may be turned on and the data voltage Vdata may be transmitted to the first node N1. When the data voltage Vdata is transmitted to the first node N1, a current flows in the first transistor M1, so that the current can flow through the OLED.

The capacitor Cst may maintain the data voltage applied to the first node N1 during a period in which one gate signal is input and then the next gate signal is input.

The gate signal gn transmitted to the gate line GL and the data voltage Vdata transmitted to the data line DL change over time, and may thus be referred to as an AC voltage. The high potential voltage EVDD applied through the power line VL and the low potential voltage EVSS applied to the cathode electrode of the OLED may be referred to as a constant voltage.

Here, the signals applied to the pixel 101 are illustrated as a data voltage Vdata, a gate signal gn, a high potential voltage EVDD, and a low potential voltage EVSS. However, without being limited thereto, the signals to be applied to the pixel 101 may be determined differently depending on a pixel structure.

Figure 5:
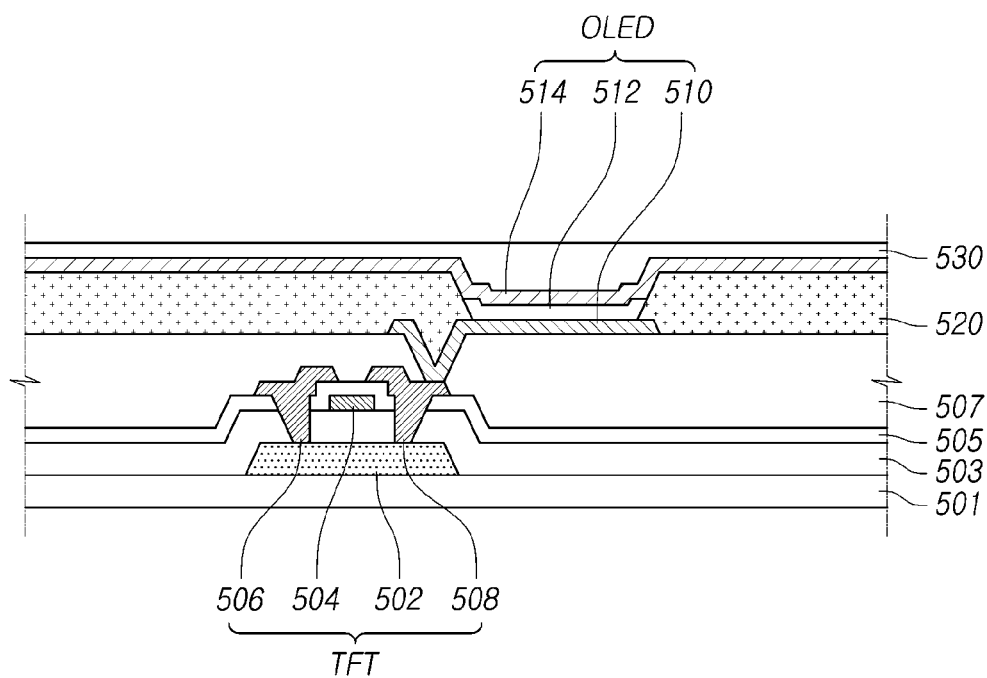
FIG. 5 is a cross-sectional view illustrating an embodiment of a cross section of a pixel employed in a display unit illustrated in FIG. 1A.

FIG. 5 is a cross-sectional view illustrating an embodiment of a cross section of a pixel employed in a display unit illustrated in FIG. 1A.

Referring to FIG. 5, in a display unit, a Thin Film Transistor (TFT) may be formed on a substrate 501, and an OLED, which includes a first electrode 510, an organic light emitting layer 512, and a second electrode 514, may be formed on the TFT.

A semiconductor layer 502, a gate insulating film 503, a gate electrode 504, an interlayer insulating film 505, and source and drain electrodes 506 and 508 are sequentially formed on a substrate 501 so as to form a TFT, and a protective film 507 may be formed on the substrate 501 on which the TFT is formed.

In this case, the substrate 501 may be a plastic substrate 501 having high heat-resistance. For example, the substrate 501 may be formed of a polyimide-based or polycarbonate-based material.

The semiconductor layer 502 may be formed of amorphous silicon or polysilicon, and in this case, a predetermined region may be doped with an impurity.

The gate insulating film 503 may be formed of an insulating material, such as a silicon oxide film (SiOx) or a silicon nitride film (SiNx). Of course, in addition to these materials, the gate insulating film 503 may also be formed of an insulating organic material. The interlayer insulating film 505 may be formed of an insulating material, such as a silicon oxide film (SiOx) or a silicon nitride film (SiNx). Of course, in addition to these materials, the interlayer insulating film 505 may also be formed of an insulating organic material. The interlayer insulating film 505 and the gate insulating film 503 may be selectively removed so as to form contact holes that expose source and drain regions.

The gate electrode 504 may be formed on the gate insulating film 503. The gate electrode 504 may be formed on the gate insulating film 503 by depositing and patterning a gate metal. In addition, the first wiring 120 illustrated in FIGS. 1A to 1C may be formed using the gate metal that forms the gate electrode 504. Signals transmitted through the first wiring 120 may be a data signal and a gate signal, and the data signal transmitted through the first wiring 120 may be transmitted to the source and drain electrodes 506 and 508 through a source drain metal connected to the gate metal.

The source and drain electrodes 506 and 508 may be formed by depositing and patterning the source drain metal on the interlayer insulating film 505 to fill the contact holes.

Further, the source and drain electrodes 506 and 508 may be formed in a single layer or multilayer shape. The second wiring 131 and the shielding layer 130 illustrated in FIGS. 1A to 1C may be formed using the source drain metal. Further, the source drain metal may be formed on the same layer as the second wiring 131 and the shield layer 130.

The protective film 507 protects and flattens a TFT. The protective film 507 may be formed in various forms. The protective film 507 may be formed of an organic insulating film, such as BCB (benzocyclobutene) or acryl, or an inorganic insulating film, such as a silicon nitride film (SiNx) or a silicon oxide film (SiOx), or may be configured in double or multiple layers, so that the protective film 507 may be variously modified.

The OLED may include a first electrode 510 formed on the protective film 507, an organic layer 512 including a light emitting layer formed on the first electrode 510, and a second electrode 514 formed on the organic layer 512. The first electrode 510 is electrically connected to the drain electrode 508 of the driving thin film transistor TFT through a contact hole. The first electrode 510 may be formed of an opaque conductive material having high reflectivity. For example, the first electrode 510 may be formed of Ag, Al, AlNd, Au, Mo, W, Cr, an alloy thereof, or the like.

A bank 520 is formed in the remaining region other than the light emitting region. Accordingly, the bank 520 may have a bank hole that exposes the first electrode 510 corresponding to the light emitting region.

The bank 520 may be formed of an inorganic insulating material, such as a silicon nitride film (SiNx) or a silicon oxide film (SiOx), or an organic insulating material, such as BCB, acrylic resin, or imide-based resin. The organic layer 512 is formed on the first electrode 510 exposed by the bank 520. The organic layer 512 may include a light emitting layer, and may further include an electron injection layer, an electron transport layer, a hole transport layer, a hole injection layer, and the like.

The second electrode 514 is formed on the substrate 501 on which the organic layer 512 is formed. The second electrode 514 may be formed of a transparent conductive material, such as Indium Tin Oxide (ITO) or Indium Zinc Oxide (IZO), so that light generated from the organic layer 512 is emitted to the upper side of the second electrode 514.

An upper encapsulation layer 530, which is attached to the second electrode 514, may be formed on the substrate 501, which is formed with the OLED. At this time, the upper encapsulation layer 530 may be a single inorganic film. The single inorganic film may include aluminum oxide (AlOx) or a silicon (Si)-based material.

In addition, the display unit may include a sealing substrate (not illustrated) formed on the upper encapsulation layer 530. Further, a touch electrode illustrated in FIGS. 1A to 1C may be formed above the display unit.

The above description and the accompanying drawings provide an example of the technical idea of the present invention for illustrative purposes only. Those having ordinary knowledge in the technical field, to which the present invention pertains, will appreciate that various modifications and changes in form, such as combination, separation, substitution, and change of a configuration, are possible without departing from the essential features of the present invention. Therefore, the embodiments disclosed in the present invention are intended to illustrate the scope of the technical idea of the present invention, and the scope of the present invention is not limited by the embodiment. The scope of the present invention shall be construed on the basis of the accompanying claims in such a manner that all of the technical ideas included within the scope equivalent to the claims belong to the present invention.

What is claimed is:

1. A display device comprising:
   a display unit formed on a substrate and including a plurality of pixels;
   a plurality of touch electrodes disposed on the display unit and configured to sense a touch point;
   a link portion formed on the substrate adjacent to and outside the display unit, and the link portion including a plurality of wirings configured to transmit an alternating current (AC) voltage and a constant voltage to the display unit;
   a touch electrode line connected to at least a corresponding one of the plurality of touch electrodes to transmit a touch drive signal; and
   a shield layer disposed between the touch electrode line and one or more of the wirings of the link portion, the constant voltage being applied to the shield layer.

2. The display device of claim 1, wherein said one or more of the wirings of the link portion carry the alternating current (AC) voltage and overlap with the touch electrode line.

3. The display device of claim 1, wherein the wirings of the link portion include a first wiring configured to transmit the alternating current (AC) voltage and a second wiring configured to transmit the constant voltage, and
   the shield layer is electrically connected to the second wiring.

4. The display device of claim 3, wherein the first wiring is formed in a same layer as a gate electrode of a thin film transistor of the display device.

5. The display device of claim 1, wherein the shield layer is formed in a same layer as a source electrode and a drain electrode of a thin film transistor of the display device.

6. The display device of claim 1, wherein the display device is an organic light emitting display, and wherein the display unit includes an organic film deposited on the substrate and a sealing substrate disposed on the organic film, and the touch electrodes are disposed on the sealing substrate.

7. A display device comprising:
   a substrate including a display unit on which a plurality of pixels are disposed in a region where gates line and data lines intersect each other, and a link portion, the link portion including a plurality of wirings configured to transmit an alternating current (AC) voltage and a constant voltage to the display unit;
   a plurality of touch electrodes disposed on the display unit and configured to sense a touch point on the display unit;
   a driver IC disposed on a side of the substrate, and configured to apply the alternating current (AC) voltage and the constant voltage to the wirings of the link portion and to transmit/receive a signal from the plurality of touch electrodes through a touch electrode line; and
   a shield layer disposed between the touch electrode line and one or more wirings of the link portion, the constant voltage being applied to the shield layer.

8. The display device of claim 7, wherein said one or more of the wirings of the link portion carry the alternating current (AC) voltage and overlap with the touch electrode line.

9. The display device of claim 7, wherein the wirings of the link portion include a first wiring configured to transmit the alternating current (AC) voltage and a second wiring configured to transmit the constant voltage, and the shield layer is electrically connected to the second wiring.

10. The display device of claim 9, wherein the first wiring is formed in a same layer as a gate electrode of a thin film transistor of the display device.

11. The display device of claim 7, wherein the shield layer is formed in a same layer as a source electrode and a drain electrode of a thin film transistor of the display device.

12. The display device of claim 7, wherein the display device is an organic light emitting display, and wherein the display unit includes an organic film deposited on the substrate and a sealing substrate disposed on the organic film, and the touch electrodes are disposed on the sealing substrate.

13. A display device comprising:
a plurality of touch electrodes;
a link portion including first wiring configured to transmit an alternating current (AC) signal and a touch electrode line configured to transmit a touch drive signal to a corresponding one of the touch electrodes, the first wiring disposed in a first layer and the touch electrode line disposed in a second layer different from the first layer; and
a shield layer disposed between the first layer and the second layer where the first wiring overlap the touch electrode line.

14. The display device of claim 13, wherein a constant voltage is applied to the shield layer.

15. The display device of claim 13, further comprising gate lines and data lines and a plurality of pixels at intersections of the gate lines and the data lines, and wherein the first wiring transmits the alternating current (AC) signal to at least one of the gate lines and the data lines.

16. The display device of claim 13, wherein the touch drive signal is an alternating current (AC) signal.

17. The display device of claim 13, wherein the link portion further include a second wiring configured to transmit the constant voltage to the shield layer.

18. The display device of claim 13, wherein the first wiring is formed in a same layer as a gate electrode of a thin film transistor of the display device.

19. The display device of claim 13, wherein the shield layer is formed in a same layer as a source electrode and a drain electrode of a thin film transistor of the display device.

20. The display device of claim 13, wherein the display device is an organic light emitting display, and the display device further comprises an organic film deposited on a substrate, and a sealing substrate disposed on the organic film, and wherein the touch electrodes are disposed on the sealing substrate.

* * * * *